United States Patent
Eakins et al.

(10) Patent No.: US 9,564,697 B2
(45) Date of Patent: Feb. 7, 2017

(54) PRESS FIT ELECTRICAL TERMINAL HAVING A SOLDER TAB SHORTER THAN PCB THICKNESS AND METHOD OF USING SAME

(71) Applicant: LEAR CORPORATION, Southfield, MI (US)

(72) Inventors: Bert William Eakins, Ortonville, MI (US); George E. Fox, Maybee, MI (US)

(73) Assignee: Lear Corporation, Southfield, MI (US)

( * ) Notice: Subject to any disclaimer, the term of this patent is extended or adjusted under 35 U.S.C. 154(b) by 49 days.

(21) Appl. No.: 14/540,480

(22) Filed: Nov. 13, 2014

(65) Prior Publication Data

US 2016/0141776 A1    May 19, 2016

(51) Int. Cl.
| | |
|---|---|
| *H05K 1/11* | (2006.01) |
| *H01R 12/58* | (2011.01) |
| *H01R 43/20* | (2006.01) |
| *H01R 4/02* | (2006.01) |
| *H05K 3/34* | (2006.01) |
| *H05K 3/40* | (2006.01) |

(52) U.S. Cl.
CPC ........... *H01R 12/585* (2013.01); *H01R 4/02* (2013.01); *H01R 43/205* (2013.01); *H05K 3/3447* (2013.01); *H05K 3/4015* (2013.01); *H05K 2201/097* (2013.01); *H05K 2201/10295* (2013.01); *H05K 2201/10787* (2013.01); *H05K 2201/10871* (2013.01); *H05K 2201/2072* (2013.01); *H05K 2203/047* (2013.01); *H05K 2203/1572* (2013.01)

(58) Field of Classification Search
CPC .............. H05K 1/02; H05K 1/11; H05K 1/16; H05K 1/18; H05K 3/00; H05K 3/08; H05K 3/34; H05K 3/46; H05K 5/00; H01R 12/00; H01R 35/00
USPC ....... 174/267, 255, 257, 260, 262, 263, 265, 174/266; 439/66, 74, 75, 83, 534, 571, 439/851, 884; 361/679.01, 748, 760, 761, 361/791, 792
See application file for complete search history.

(56) References Cited

U.S. PATENT DOCUMENTS

| | | | | |
|---|---|---|---|---|
| 3,875,479 A | * | 4/1975 | Jaggar ................. | H05K 1/112 174/260 |
| 4,354,729 A | * | 10/1982 | Grabbe ............... | H05K 7/1069 29/874 |
| 4,420,877 A | * | 12/1983 | McKenzie, Jr. ...... | H05K 3/308 228/180.1 |

(Continued)

FOREIGN PATENT DOCUMENTS

| | | |
|---|---|---|
| DE | 10149574 A1 | 4/2003 |
| EP | 1917844 B1 | 10/2010 |

*Primary Examiner* — Xiaoliang Chen
(74) *Attorney, Agent, or Firm* — Fishman Stewart PLLC

(57) ABSTRACT

A method of assembling a circuit board may include inserting a first electrical terminal into a first side of a circuit board, and applying a second layer of solder paste to a second side of the circuit board, the second side disposed opposite of the first side. The first electrical terminal may include a solder tab, a maximum length of the solder tab may be shorter than a minimum thickness of the circuit board, and if the first electrical terminal is inserted into the circuit board, the solder tab may extend at least partially into the circuit board without extending entirely through the circuit board. One or more electrical terminals with short and/or long solder tabs may be inserted into the second side of the circuit board and/or one or more electrical components may be attached to second side of circuit board.

9 Claims, 8 Drawing Sheets

(56) References Cited

U.S. PATENT DOCUMENTS

| | | | |
|---|---|---|---|
| 4,515,304 A | 5/1985 | Berger | |
| 4,998,342 A | 3/1991 | Bonnell et al. | |
| 5,029,748 A * | 7/1991 | Lauterbach | B23K 3/087 |
| | | | 228/180.1 |
| 5,037,315 A * | 8/1991 | Collier | H01R 12/57 |
| | | | 439/637 |
| 5,178,318 A | 1/1993 | Edwin et al. | |
| 5,273,460 A * | 12/1993 | Arai | H05K 3/301 |
| | | | 439/567 |
| 5,410,452 A * | 4/1995 | Sinclair | H01R 9/091 |
| | | | 29/838 |
| 5,737,834 A | 4/1998 | Sabotke et al. | |
| 6,062,916 A * | 5/2000 | Gladd | H01R 9/091 |
| | | | 439/751 |
| 6,081,998 A * | 7/2000 | Terauchi | H05K 3/303 |
| | | | 29/842 |
| 6,159,045 A * | 12/2000 | Vicich | H05K 3/3447 |
| | | | 174/260 |
| 6,179,631 B1 * | 1/2001 | Downes | H01R 9/091 |
| | | | 228/246 |
| 6,644,983 B2 * | 11/2003 | Recktenwald | H01R 13/111 |
| | | | 439/75 |
| 6,663,442 B1 * | 12/2003 | Helster | H01R 9/091 |
| | | | 174/266 |
| 6,963,494 B2 * | 11/2005 | Mickievicz | H05K 1/112 |
| | | | 257/774 |
| 7,112,071 B2 | 9/2006 | Nakagawa et al. | |
| 7,983,024 B2 | 7/2011 | Harris, IV | |
| 8,057,240 B2 * | 11/2011 | Morgan | H01R 12/58 |
| | | | 439/55 |
| 8,528,195 B2 | 9/2013 | Wu et al. | |
| 8,923,007 B2 * | 12/2014 | Sweeney | H05K 1/18 |
| | | | 174/262 |
| 2001/0032388 A1 * | 10/2001 | Morris | H05K 1/112 |
| | | | 29/852 |
| 2002/0076957 A1 * | 6/2002 | Low et al. | H01R 12/58 |
| | | | 439/82 |
| 2003/0006061 A1 * | 1/2003 | Brinthaupt, III | H05K 1/0201 |
| | | | 174/255 |
| 2003/0079911 A1 * | 5/2003 | Bogursky | H01R 4/024 |
| | | | 174/267 |
| 2003/0174477 A1 * | 9/2003 | Ohtani | H01L 23/49861 |
| | | | 361/760 |
| 2003/0232522 A1 * | 12/2003 | Buondelmonte | H05K 3/368 |
| | | | 439/74 |
| 2004/0012931 A1 * | 1/2004 | Pitzele | H01R 9/091 |
| | | | 361/748 |
| 2004/0062015 A1 * | 4/2004 | Belopolsky | H05K 3/3415 |
| | | | 361/760 |
| 2004/0137803 A1 * | 7/2004 | Pitzele | H01R 9/091 |
| | | | 439/884 |
| 2004/0251046 A1 * | 12/2004 | Mickievicz | H05K 1/112 |
| | | | 174/260 |
| 2005/0263322 A1 * | 12/2005 | Mickievicz | H05K 1/112 |
| | | | 174/260 |
| 2006/0267217 A1 * | 11/2006 | Wong | H01L 23/49811 |
| | | | 257/779 |
| 2007/0099490 A1 * | 5/2007 | Takizawa | H05K 3/3415 |
| | | | 439/534 |
| 2007/0193774 A1 * | 8/2007 | Ito | H05K 1/111 |
| | | | 174/260 |
| 2008/0064232 A1 * | 3/2008 | Reiss | G11B 23/40 |
| | | | 439/66 |
| 2008/0094790 A1 * | 4/2008 | Song | H05K 1/0254 |
| | | | 361/679.01 |
| 2008/0146051 A1 * | 6/2008 | Honda | H01R 43/0256 |
| | | | 439/66 |
| 2008/0173472 A1 * | 7/2008 | Takizawa | H05K 1/116 |
| | | | 174/260 |
| 2008/0254688 A1 * | 10/2008 | Bogursky | H01R 13/113 |
| | | | 439/858 |
| 2009/0068864 A1 * | 3/2009 | Honda | H01R 43/0256 |
| | | | 439/83 |
| 2009/0305556 A1 * | 12/2009 | Kawahara | H01R 12/7029 |
| | | | 439/544 |
| 2010/0288547 A1 * | 11/2010 | Hayashi | H01R 12/7029 |
| | | | 174/260 |
| 2013/0146347 A1 * | 6/2013 | McConnell | H01G 4/30 |
| | | | 174/260 |
| 2013/0213705 A1 * | 8/2013 | Suehiro | H05K 3/0047 |
| | | | 174/262 |
| 2013/0327563 A1 * | 12/2013 | Kitagawa | H05K 1/116 |
| | | | 174/257 |

* cited by examiner

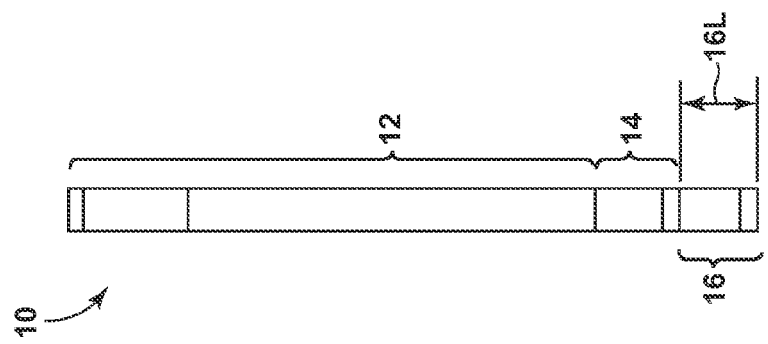
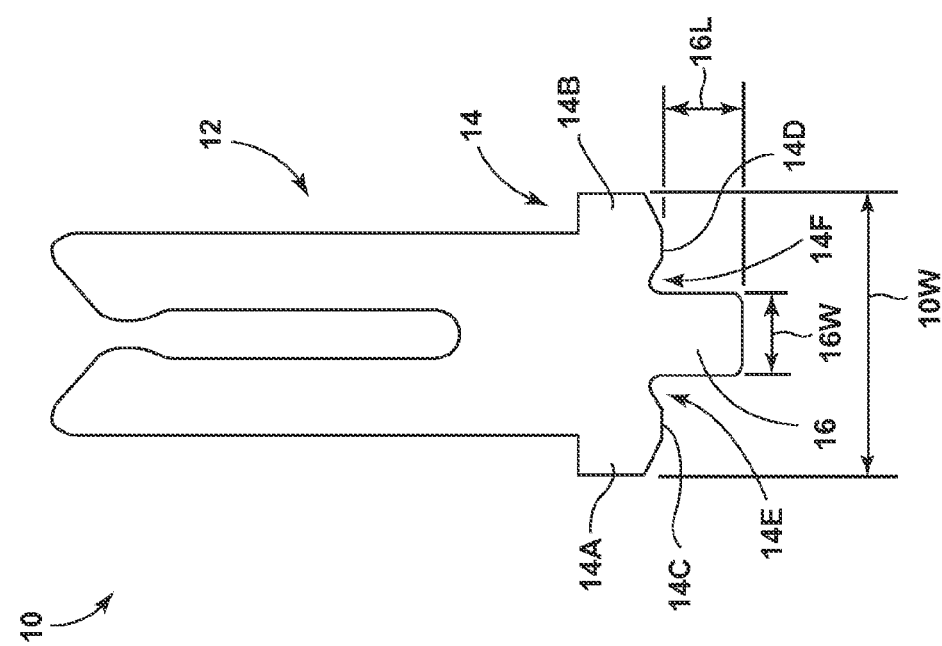

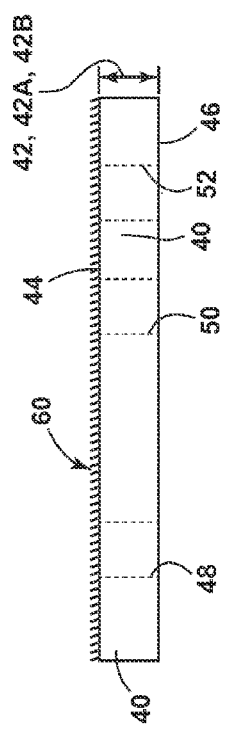
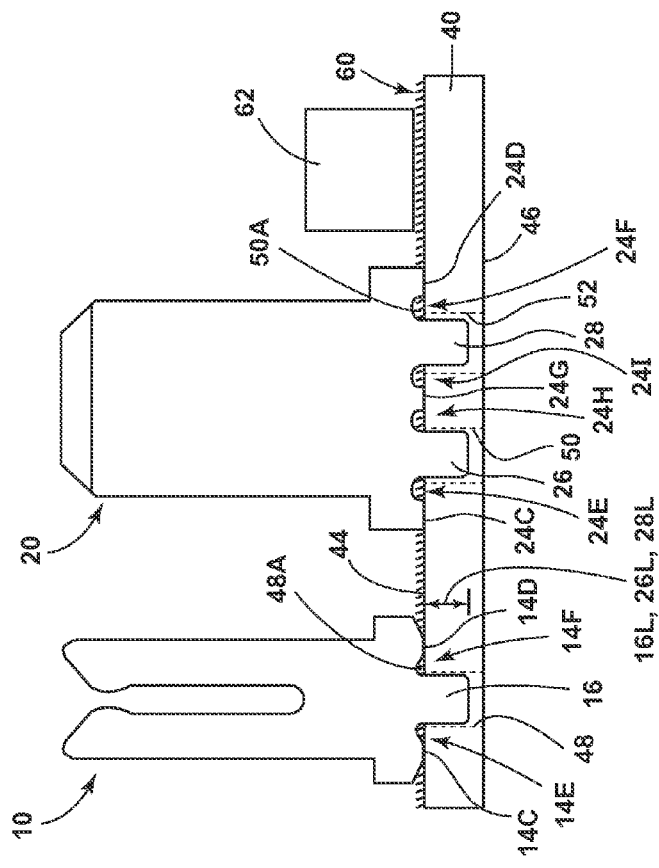
FIG. 3A
FIG. 3B

PRESS FIT ELECTRICAL TERMINAL HAVING A SOLDER TAB SHORTER THAN PCB THICKNESS AND METHOD OF USING SAME

TECHNICAL FIELD

The present disclosure relates to electrical components, including electrical connectors, electrical terminals, and/or circuit boards.

BACKGROUND

Conventional electrical terminals may often be assembled to circuit boards via soldering portions of the terminals to a circuit board. Part of the assembly process often includes inserting at least a portion of the terminal entirely through the circuit board so that the terminal can be soldered on the top and bottom of the circuit board. However, the presence of a portion of a terminal protruding through the bottom of the circuit board can make the process of assembling other components to the bottom of the circuit difficult and imprecise. For example, a spreading device (e.g., a squeegee) for applying solder paste to the bottom of the circuit board may not be able to adequately compensate for the uneven surface of the bottom of the circuit board caused by the protruding terminal portions. The spreading devices may then inconsistently apply the solder paste and/or may apply too much solder paste in certain areas, either of which may result in undesired behavior of the solder paste upon heating (e.g., dripping). Applying solder paste to both sides of a circuit board prior to an installation of terminals may not be desirable as there may be increased opportunities for the solder paste to be disturbed (e.g., solder paste on one side may be more easily disturbed during installation of terminals to the other side).

SUMMARY

The present disclosure includes embodiments of a method of assembling a circuit board that may comprise applying a first layer of solder paste to a first side of the circuit board, inserting a first electrical terminal through the first layer of solder paste into the first side of the circuit board, heating the solder paste to fix the first electrical terminal relative to the circuit board, and/or applying a second layer of solder paste to a second side of the circuit board, the second side disposed opposite of the first side. In embodiments, the first electrical terminal may include a solder tab, a maximum length of the solder tab may be shorter than a minimum thickness of the circuit board, and/or if the first electrical terminal is inserted into the circuit board, the solder tab may extend at least partially into the circuit board without extending entirely through the circuit board.

In embodiments, a circuit board assembly may comprise a circuit board, a first electrical terminal, and/or a layer of solder paste. In embodiments, the circuit board may include a minimum thickness, a first side, and/or a second side opposite the first side. In embodiments, the first electrical terminal may include a solder tab that may have a maximum length that is shorter than the minimum thickness of the circuit board. In embodiments, the layer of solder paste may be disposed on the first side of the circuit board and/or the solder tab of the first electrical terminal may extend into the first side of the circuit board.

In embodiments, an electrical terminal may comprise a body that may include an electrical connector and/or a first solder tab. In embodiments, the solder tab may include a maximum length that is shorter than a minimum thickness of a corresponding circuit board.

BRIEF DESCRIPTION OF THE DRAWINGS

FIGS. 1A and 1B are front and side views of embodiments of an electrical terminal in accordance with teachings of the present disclosure.

FIG. 3A is a side view of a circuit board and a layer of solder paste in accordance with teachings of the present disclosure.

FIG. 3B is a side view of an embodiment of a circuit board assembly in accordance with teachings of the present disclosure.

DETAILED DESCRIPTION

Figure 2B:
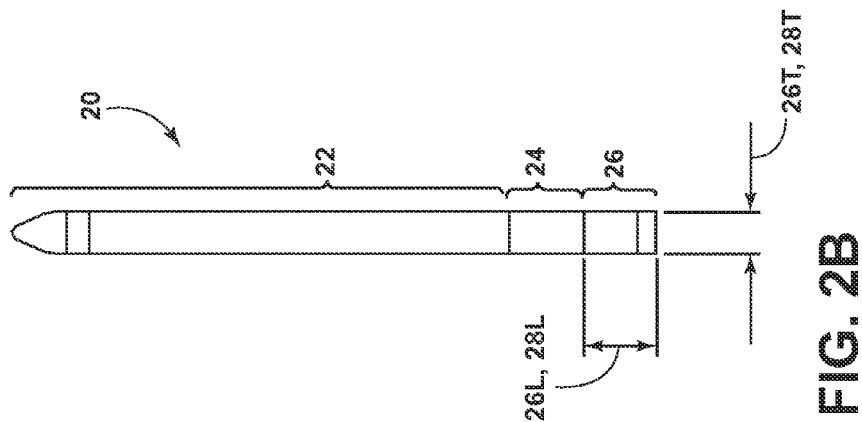
FIGS. 2A and 2B are front and side views of embodiments of an electrical terminal in accordance with teachings of the present disclosure.

Reference will now be made in detail to embodiments of the present disclosure, examples of which are described herein and illustrated in the accompanying drawings. While the invention will be described in conjunction with embodiments and/or examples, it will be understood that they are not intended to limit the invention to these embodiments and/or examples. On the contrary, the invention is intended to cover alternatives, modifications and equivalents, which may be included within the spirit and scope of the invention as defined by the appended claims.

Referring to the drawings, FIGS. 1A, 1B, 2A, and 2B generally illustrate embodiments of electrical terminals 10, 20. Electrical terminals 10, 20 may include an electrical connector portion 12, 22, a body portion 14, 24, and/or one or more solder tabs 16, 26, 28. An electrical connector portion 12, 22 may be disposed at first end of an electrical terminal 10, 20 and/or a solder tab 16, 26, 28 may be disposed at an opposite end of the electrical terminal 10, 20. A body portion 14, 24 may be disposed between an electrical connector portion 12, 22 and a solder tab 16 or solder tabs 26, 28.

In embodiments, electrical connector portions 12, 22 may be configured for electrical connection with one or more of a variety of electrical components. In embodiments, such as generally illustrated in FIGS. 1A and 1B, electrical connector portions 12 may include a female configuration and/or may be configured to receive a corresponding male portion of a corresponding electrical component. In embodiments, such as generally illustrated in FIGS. 2A and 2B, electrical connector portion 22 may include a male configuration and/or may be configured to be received by a corresponding female portion of a corresponding electrical component.

In embodiments, a body portion 14, 24 may include one or more protrusions 14A, 14B, 24A, 24B that may extend laterally outward. Protrusions 14A, 14B, 24A, 24B may generally correspond to an increased maximum width 10W, 20W of an electrical terminal 10, 20. In embodiments, a body portion 14, 24 may be configured to contact a circuit board 40 and/or a layer of solder paste 60, 70 if an electrical terminal 10, 20 is inserted into circuit board 40. For example, and without limitation, contact portions 14C, 14D, 24C, 24D may be configured to contact circuit board 40 and/or plating of a hole that may be a plated through hole ("PTH"). As generally illustrated in FIGS. 3A and 3B, circuit board 40 may include holes 48, 50, 52, any or all of which may be PTHs. In embodiments, a body portion 14, 24 may include one or more recesses 14E, 14F, 24E, 24F. Recesses 14E, 14F, 24E, 24F may be configured to compensate for copper and/or PTH plating that may be displaced during insertion of an electrical terminal 10, 20 into circuit board 40. For example, and without limitation, displaced copper and/or plating (e.g., plating 48A, 50A) may accumulate in one or more of recesses 14E, 14F, 24E, 24F instead of accumulating under contact portions 14C, 14D, 24C, 24D, which might otherwise prevent contact portions 14C, 14D, 24C, 24D from contacting circuit board 40 and/or being sufficiently close to circuit board 40 (e.g., sufficiently close to provide stability). In embodiments, body portion 24 of terminal 20 may include an additional contact portion 24G that may be disposed between solder tabs 26, 28 and/or may be configured to contact circuit board 40 if terminal 20 is inserted into circuit board 40. One or more recesses 24H, 24I may be disposed adjacent to and/or on opposite sides of contact portion 24G.

In embodiments, such as generally illustrated in FIGS. 1A and 1B, electrical terminal 10 may include a single solder tab 16. Solder tab 16 may be configured for insertion into circuit board 40. Solder tab 16 may include having a width 16W that may correspond to a corresponding hole (e.g., hole 48) in circuit board 40. In embodiments, width 16W of solder tab 16 may be configured for a press fit with a corresponding hole (e.g., width 16W may be substantially the same as the width of corresponding hole 48).

Figure 2A:
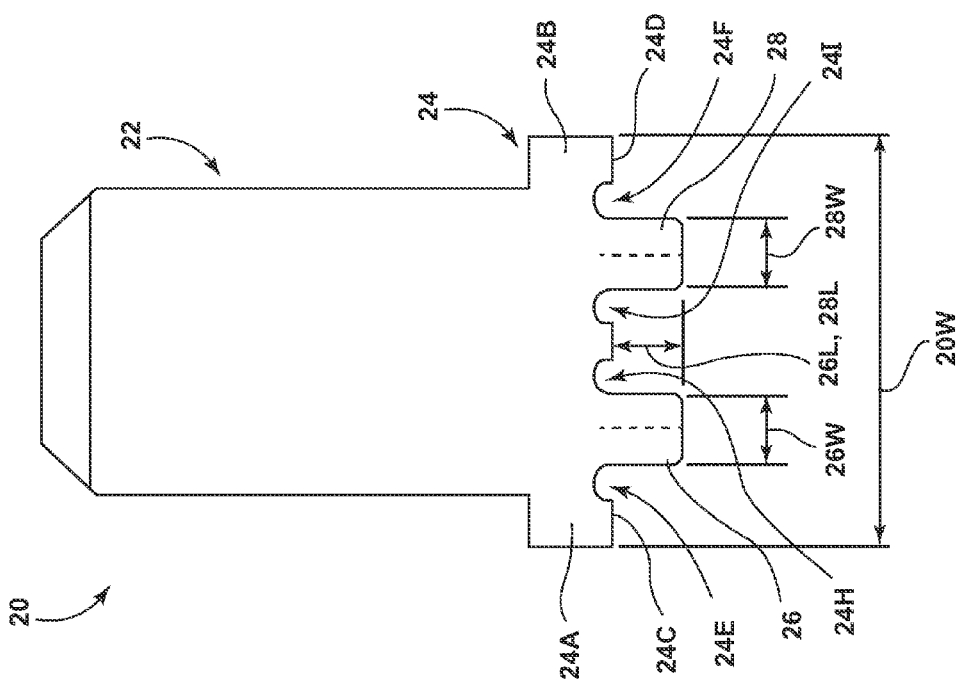

In embodiments, such as generally illustrated in FIGS. 2A and 2B, electrical terminal 20 may include a plurality of solder tabs 26, 28. Solder tabs 26, 28 may include the same or substantially similar configurations (e.g., lengths 26L, 28L, widths 26W, 28W, thickness 26T, 28T etc.) as each other and/or as solder tab 16. In embodiments, a first one 26 of the plurality of solder tabs may correspond to a first hole 50 of circuit board 40 and/or a second one 28 of the plurality of solder tabs may correspond to a second hole 52 of circuit board 40. In embodiments, first solder tab 26 and/or second solder tab 28 may be configured to allow for manufacturing tolerances. For example, and without limitation, first solder tab 26 may be configured for a press fit with first hole 50 and/or second solder tab 28 may be configured for a clearance fit with second hole 52. A clearance fit for second solder tab 28 (e.g., as opposed to first and second solder tabs 26, 28 both being configured for press fits) may help compensate for manufacturing tolerances. In embodiments, solder tabs 26, 28 of electrical terminal 20 may include different lengths 26L, 28L that may both be shorter than the thickness 42 of circuit board in the area of holes 50, 52, respectively and/or may be shorter than the minimum thickness 42B of circuit board 40. In embodiments, first hole 50 and second hole 52 may be the same size and one of first solder tab 26 and second solder tab 28 may be configured for a press fit and the other may be configured for a clearance fit (e.g., tab 26 or tab 28 may include a greater width and/or cross-sectional area than the other).

In embodiments, such as generally illustrated in FIG. 3A, circuit board 40 may include thickness 42. In embodiments, thickness 42 may be generally uniform and/or may include a maximum thickness 42A and/or a minimum thickness 42B. In embodiments, circuit board 40 may include a first side 44 and/or a second side 46. First side 44 and second side 46 may be opposite from each other and/or may face away from each other.

In embodiments, such as generally illustrated in FIGS. 3A, 3B, 4A, 4B, and 4C, a layer of solder paste 60 may be disposed and/or spread on circuit board 40, such as on first side 44 and/or second side 46. Solder paste may include solder cream and/or other suitable materials, such as electrically conductive materials that may be capable of at least temporarily holding electrical components 62, 72 which may include, for example, surface mount devices ("SMDs"), relative to a circuit board 40. Additionally or alternatively, solder paste may be capable of permanently fixing electrical components 62, 72, to circuit board 40. Layers of solder paste (e.g., layers 60, 70) may be configured to at least temporarily hold electrical components 62, 72 to circuit board 40. In a first state, solder paste may include a spreadable/malleable substance and/or a highly viscous substance. Solder paste in its first state may be used to temporarily hold electrical components 62, 72 relative to circuit board 40. In a second state, which may be achieved while the solder paste is at a relatively high temperature (e.g., at or above its liquidus temperature, which may be greater than 200 degrees Celsius), solder paste may include a liquid substance. Solder paste in its second state may flow to various areas of circuit board 40 and/or come into contact with some or all of electrical components 62, 72, and/or terminals, 10, 20, 30, 34. In a third state, which may be achieved after the solder paste is heated to and/or above its liquidus point and then cooled down, solder paste may include a solid material that may not be spreadable/malleable. Solder paste in the third state may be configured to permanently fix one element to another (e.g., electrical terminals 10, 20 and/or electrical components 62, 72 to circuit board 40).

In embodiments, circuit board 40 may include one or more holes 48, 50, 52, 54, 56, which may be referred to herein as holes 48-56. In embodiments, one or more of holes 48-56 may correspond to solder tabs (e.g., solder tabs 16, 26, 28, 32, 36) of electrical terminals 10, 20, 30, 34. For example and without limitation, hole 48 may correspond to solder tab 16 and/or may be configured for a press fit with solder tab 16. In embodiments, some or all of the depths of holes 48-56 may be at least as deep as the thickness 42 of circuit board (e.g., may be through holes) and/or some or all of depths of holes may not be as deep as the 42 thickness of circuit board (e.g., may be blind holes). In embodiments, one or more of holes 48-56 may be configured for a press fit with a corresponding solder tab and/or one or more of holes 48-56 may be configured for a clearance fit with a corresponding solder tab. For example, and without limitation, hole 50 may be configured for a press fit with solder tab 26 and/or hole 52 may be configured for a clearance fit with solder tab 28 (e.g., hole 52 may include a greater width, radius, and/or circumference than hole 50, even if solder tab 26 and solder tab 28 are substantially the same size).

Figure 4A:
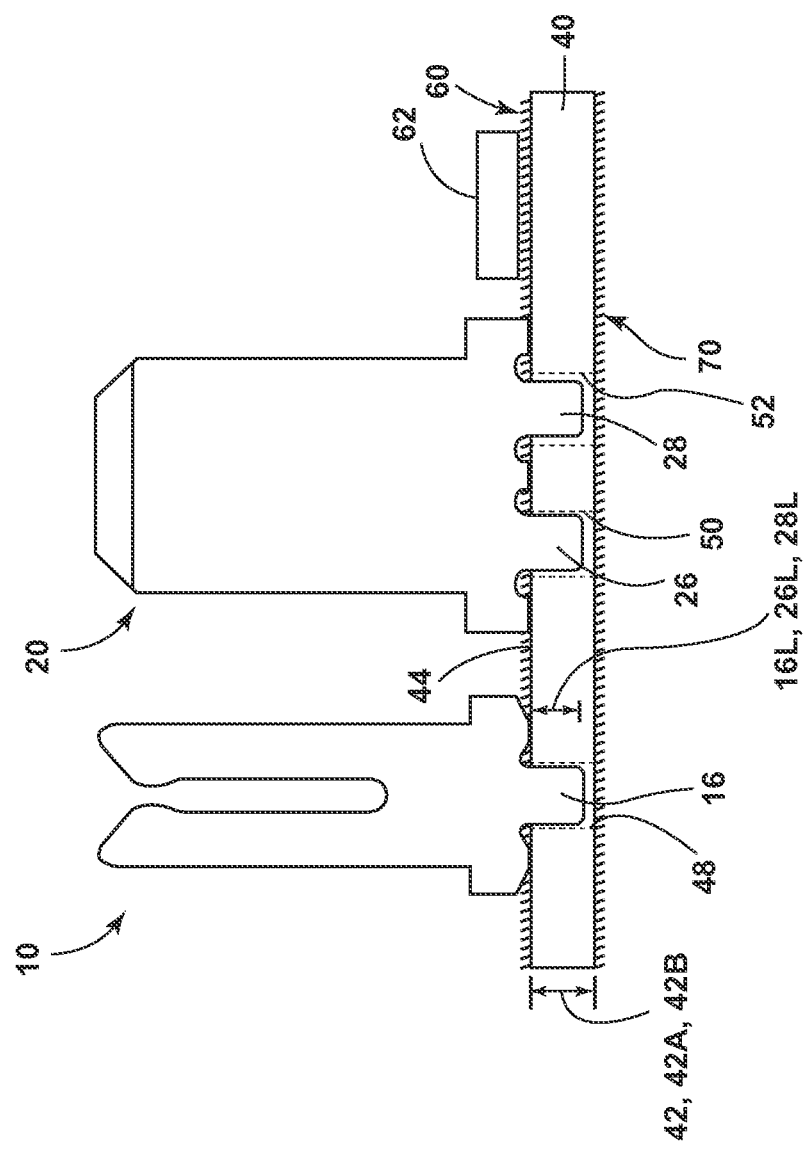
FIGS. 4A, 4B, and 4C are side views of embodiments of a circuit board assembly in accordance with teachings of the present disclosure.
Figure 4B:
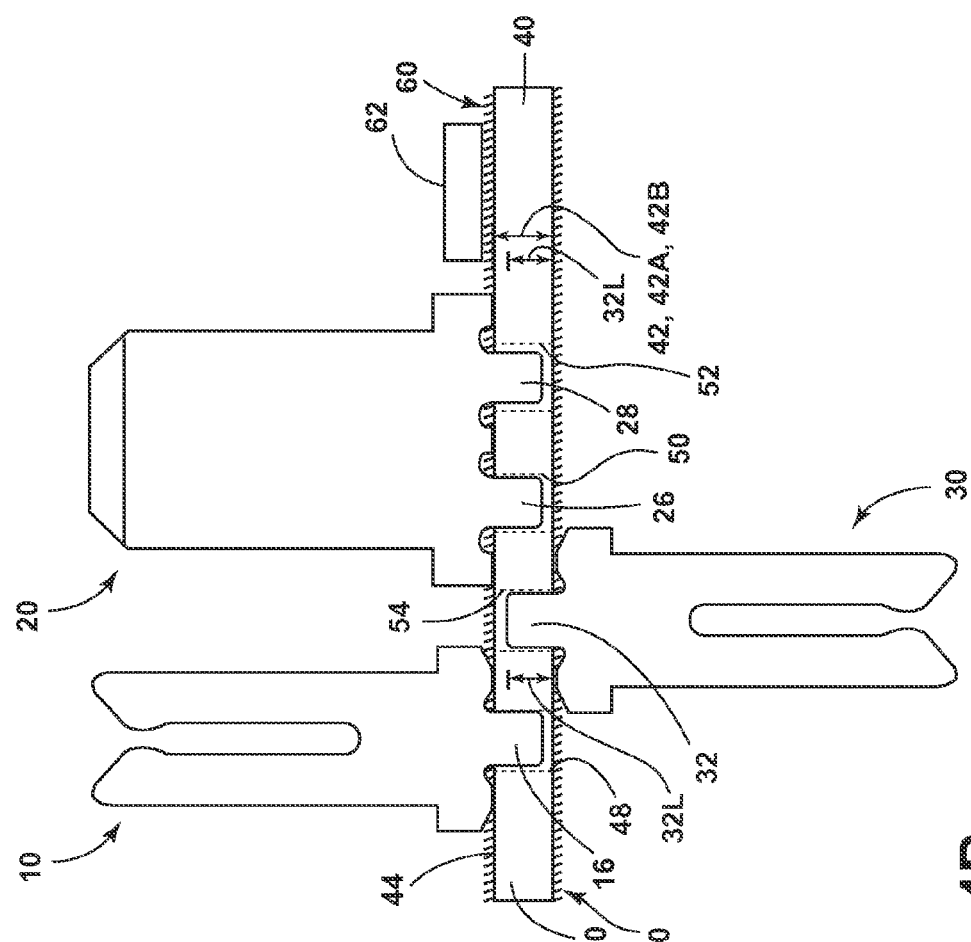

In embodiments, such as generally illustrated in FIGS. 3B, 4A, and 4B, solder tabs of electrical terminals may include maximum lengths 16L, 26L, 28L. In embodiments, the maximum lengths 16L, 26L, 28L of solder tabs 16, 26, 28 may be about the same as and/or shorter than thickness 42 and/or minimum thickness 42B of circuit board 40. In embodiments, lengths 16L, 26L, 28L may be at least 75% of the thickness 42 and/or minimum thickness 42B of circuit board 40 (e.g., upon insertion, solder tabs 16, 26, 28 may extend at least 75% through circuit board 40). For example, and without limitation, circuit board 40 may include a thickness 42 (which may be equal to its minimum thickness 42B) of about 1.55 mm and/or lengths of solder tab may be at least 1.1625 mm, but less than 1.55 mm. In embodiments, the lengths 16L, 26L, 28L of solder tabs 16, 26, 28 may be about 89% of the thickness circuit board and/or about 1.4 mm (e.g., upon insertion, solder tabs 16, 26, 28 may extend about 89% through circuit board 40). In embodiments, such as generally illustrated in FIG. 3B, if electrical terminals 10, 20 are inserted into circuit board 40, solder tabs 16, 26, 28 may extend into first side 44 of circuit board 40 without extending beyond second side 46, contact portions 14C, 14D, 24C, 24D may contact circuit board 40, and/or copper and/or plating may be displaced to one or more of recesses 14E, 14F, 24E, 24F, 24H, 24I.

In embodiments, such as generally illustrated in FIGS. 3A, 3B, 4A, 4B, 4C, and 4D, a first step 80 of a method 78 of assembling circuit board 40 may include providing a circuit board 40. Circuit board may, at least initially, be at a relatively low temperature (e.g., room temperature). In step 82, a first layer of solder paste 60, which may be in its first state, may be applied (e.g., spread) onto first side 44 of circuit board 40. In step 84, one or more electrical terminals 10, 20 may then be inserted into first side 44 of circuit board 40. Once inserted, solder tabs 16, 26, 28 of terminals 10, 20 may extend into first side 44 without extending beyond second side 46 and/or may extend short of second side 46. Solder paste may help hold the one or more electrical components 62 in place. In step 86, the layer of solder paste 60 may then be heated and/or hardened in some manner (e.g., via placing the circuit board 40, solder paste layer 60, electrical components 62, and/or electrical terminals 10, 20 in a reflow oven), which may allow the solder paste of layer 60 to flow easily and/or establish an electrical connection between circuit board 40, electrical components 62, and/or the one or more electrical terminals 10, 20. The solder paste may then be cooled, which may result in the solder paste achieving its third state. Solder paste in its third state may, for example, permanently fix and electrically connect the one or more terminals 10, 20 and/or electrical components 62 with circuit board 40. As this point, circuit board 40 may include one or more electrical terminals 10, 20 inserted into it and/or one or more electrical components 62 attached to it; however, with embodiments of the configuration, none of the one or more electrical terminals 10, 20 necessarily extend beyond and/or through to the second side 46 of circuit board 40 (e.g., second side 46 of circuit board 40 may be flat/uninterrupted by solder tabs 16, 26, 28).

Figure 4C:
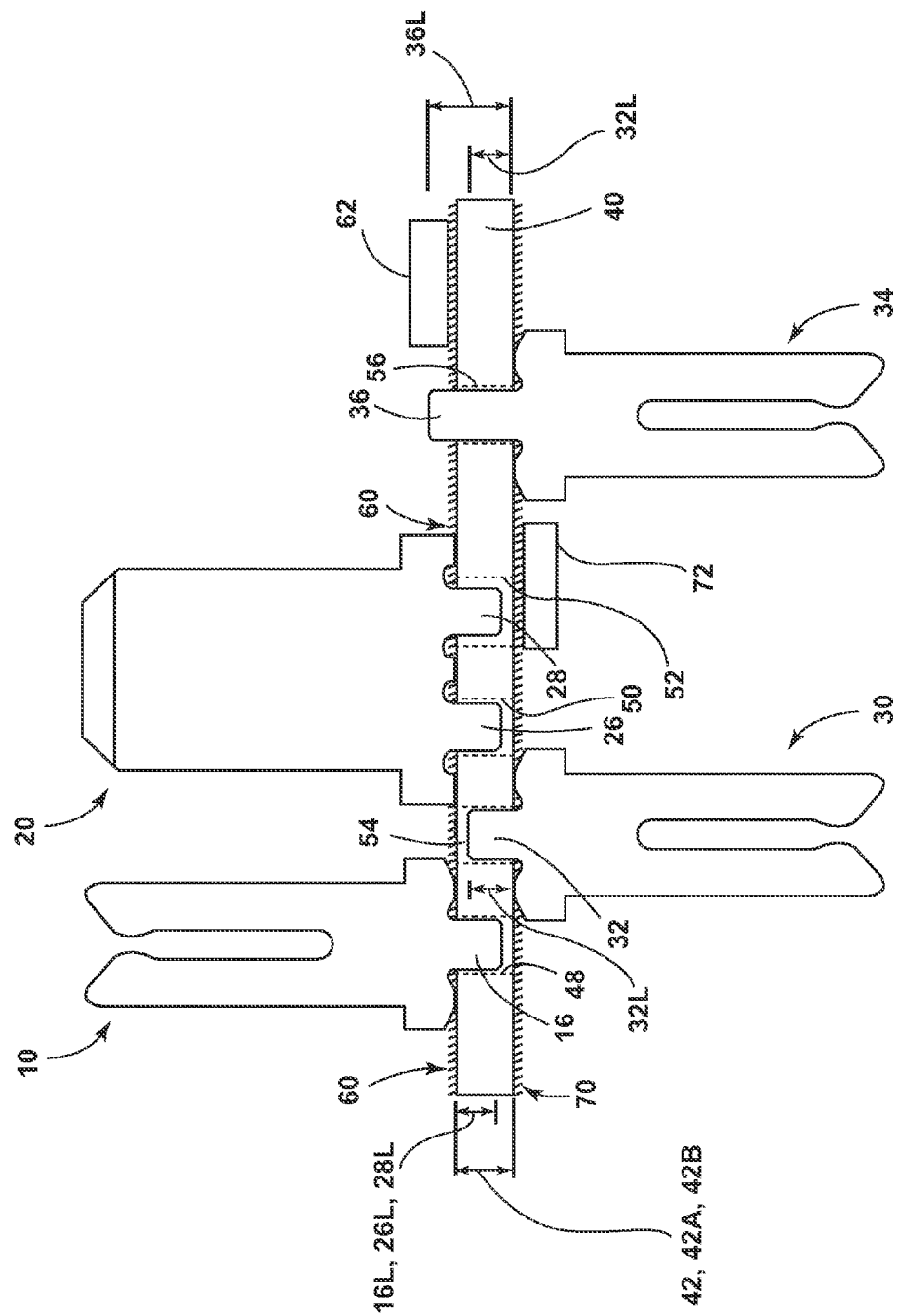
Figure 4D:
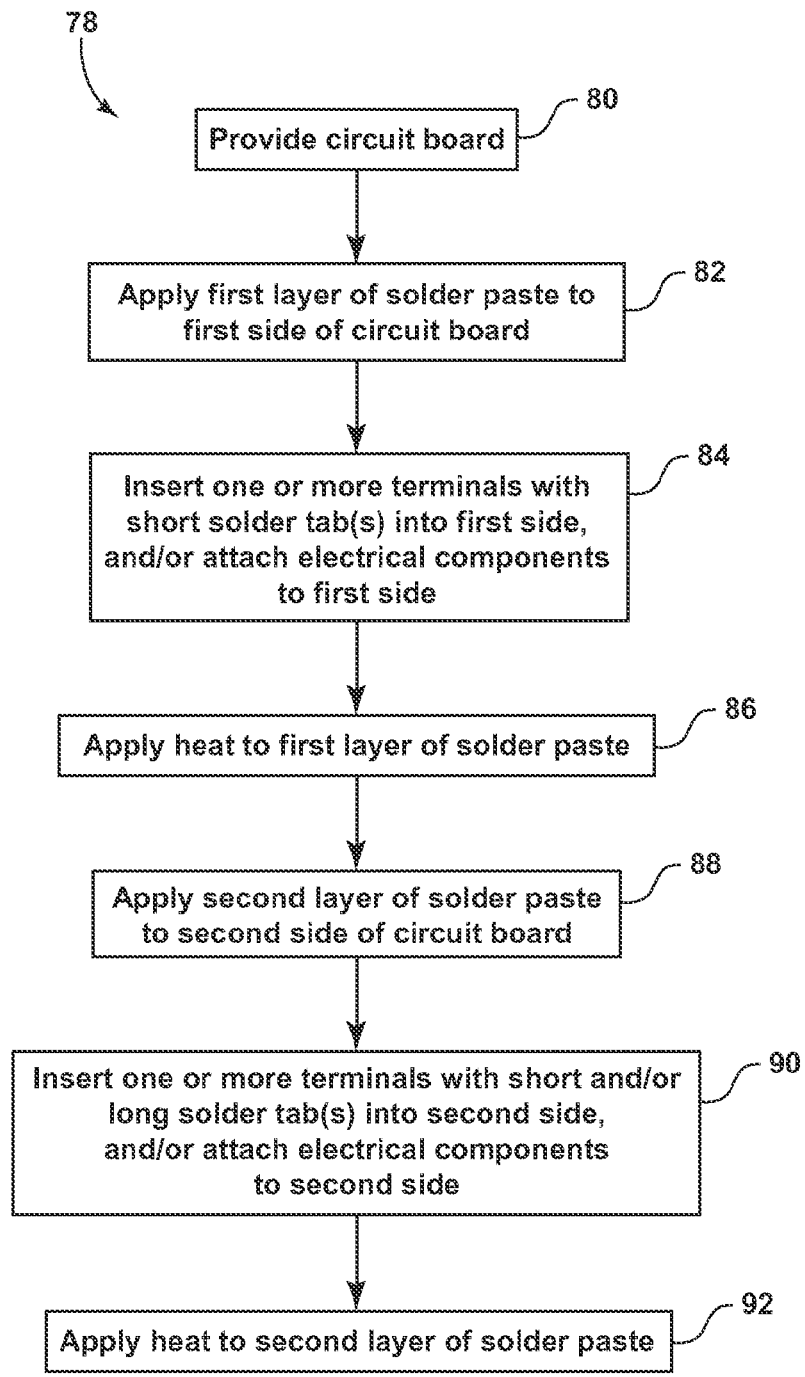
FIGS. 4D and 4E are block diagrams of embodiments of methods of assembling a circuit board in accordance with teachings of the present disclosure.

In embodiments, such as generally illustrated in FIG. 4A, once the one or more terminals 10, 20 and/or electrical components 62 have been permanently fixed to circuit board 40, a second layer of solder paste 70, which may be in its first state, may be applied to/spread on second side 46 of circuit board 40 in step 88. In embodiments, second layer of solder paste 70 may include a lower liquidus point than first layer of solder paste 60. As second side 46 of circuit board 40 may be generally flat (e.g., uninterrupted by terminals/solder tabs 16, 26, 28 because they may not extend through from first side 44), application/spreading of second layer of solder paste 70 to second side may be relatively simple and/or may be relatively uniform. In embodiments, such as generally illustrated in FIGS. 4B and 4C, in step 90, one or more additional terminals (e.g., terminals 30, 34) may be inserted through second layer of solder paste 70 and/or into second side 46 of circuit board 40.

In embodiments, terminal 30 and/or terminal 34, which may be inserted into second side 46, may include solder tabs 32, 36 that may or may not have lengths shorter than the thickness 42 of circuit board. For example, and without limitation, as generally illustrated in FIG. 4C, electrical terminal 30 may be inserted into second side of circuit board 46 and may include a solder tab 32 with a length 32L that may be no longer than and/or shorter than thickness 42 and/or minimum thickness 42B of circuit board 40. Electrical terminal 34 may be inserted into second side 46 of circuit board 40 and may include a solder tab 36 with a length 36L that may be longer than the thickness 42 and/or minimum thickness 42B of circuit board 40. For example, and without limitation, long solder tab 36 may include a length greater than 1.55 mm. Inserting an electrical terminal with a longer solder tab (e.g., solder tab 36) into second side, which may include solder tab 36 extending into second side 46 through circuit board 40 and protruding through/from first side 44, may not interfere with solder paste application as solder paste may be complete (e.g., already applied to first side 44 and second side 46).

In embodiments, once all desired components (e.g., terminals 30, 34 and/or electrical components 72) have been inserted into and/or attached to second side 46, second layer of solder paste 70 may be heated and/or hardened in some manner (e.g., via a reflow oven) in step 92 to harden the solder paste, and/or permanently fix and/or electrically connect inserted components with circuit board 40. In embodiments, second layer of solder paste 70 may include a lower liquidus point than first layer of solder paste 60, which may allow for heating of step 92 to be at a lower temperature than heating in step 86. Lower temperature heating may be desirable, for some applications, as it may prevent softening and/or dripping of first layer of solder paste 60. Circuit board 40 may then comprise some or all of the following: one or more terminals with short solder tabs permanently fixed and electrically connected to first side 44 (e.g., terminals 10, 20), one or more electrical components 62 permanently fixed and electrically connected to first side 44, one or more terminals with short solder tabs permanently fixed and electrically connected to second side 46 (e.g., terminal 30), one or more terminals with long solder tabs permanently fixed and electrically connected to second side 46 (e.g., terminal 34), and/or one or more electrical components 72 permanently fixed and electrically connected to second side 46.

Figure 4E:
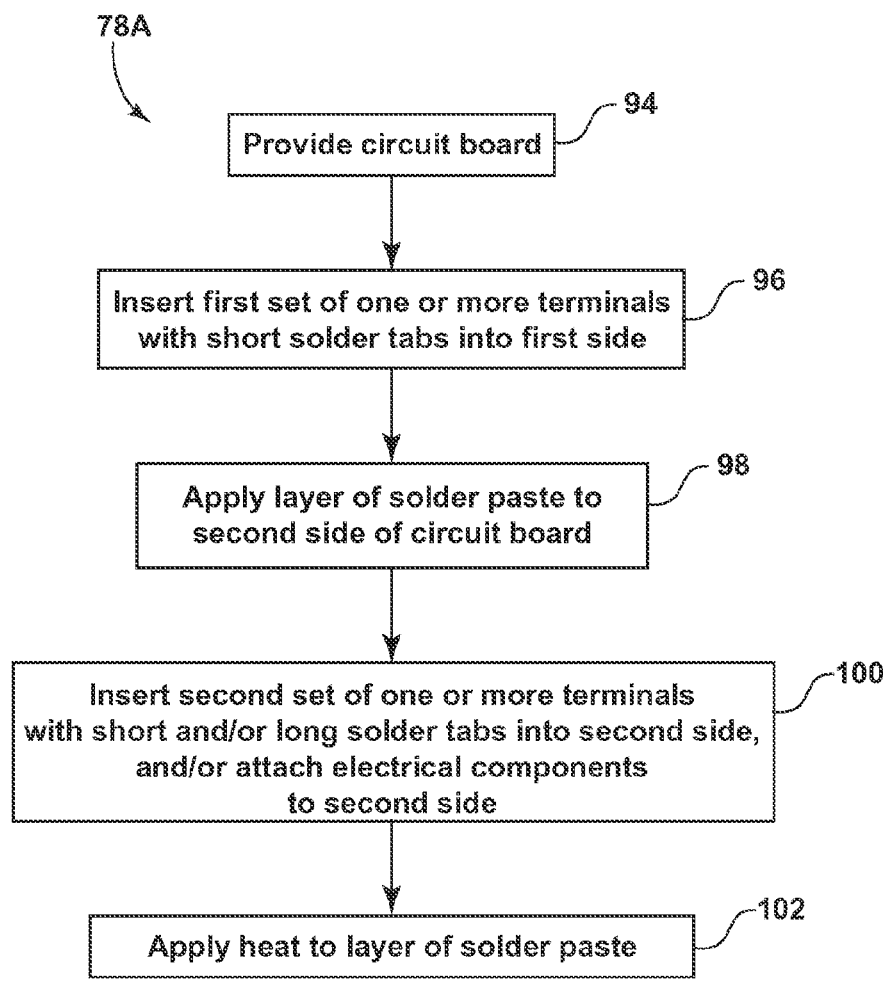

In embodiments, such as generally illustrated in FIG. 4E, a method 78A of assembling a circuit board 40 may include, in step 94, providing a circuit board 40. In step 96, one or more terminals with short solder tabs (e.g., terminals 10, 20) may be inserted into first side 44 of circuit board 40 without having applied a first layer of solder paste 60 (e.g., as in step 82 of method 78). In embodiments, solder paste layer 70 may be applied to the second side of circuit board 40 in step 98 without having applied heat in step 86. In step 100, terminals (e.g., terminals 30, 34) may be inserted into second side 46 of circuit board 40 and/or electrical components 72 may be at least temporarily attached to circuit board 40 via solder paste layer 70. Also, in step 100, one or more electrical components 72 may be attached to (e.g., disposed on and/or in solder paste layer 70) second side 46. Then, in step 102, heat may be applied to solder paste layer 70. Heating solder paste layer 70 may cause solder paste to enter one or more of holes 48-56 and/or may permanently fix one or more of terminals 10, 20, 30, 34 and/or electrical components 72 to circuit board 40. In embodiments, inserting one or more terminals into circuit board 40 before applying solder paste may be desirable because inserting terminals may be a relatively violent process and/or may disturb solder paste that had been previously applied and not heated/hardened to achieve its third state. For example, and without limitation, inserting terminals 10, 20 into first side 44 of circuit board may disturb solder paste in its first state that may have been previously applied to second side 46 (e.g., if layer 70 was applied before insertion of terminals 10, 20).

The foregoing descriptions of specific embodiments of the present invention have been presented for purposes of illustration and description. They are not intended to be exhaustive or to limit the invention to the precise forms disclosed, and various modifications and variations are possible in light of the above teaching. It should be understood that references to a single element are also intended to include embodiments that may include more than one of that element or zero of that element. It should also be understood that any example provided is not intended to be exhaustive or limit the invention. The embodiments were chosen and described in order to explain the principles of the invention and its practical application, to thereby enable others skilled in the art to utilize the invention and various embodiments with various modifications as are suited to the particular use contemplated. It is intended that the scope of the invention be defined by the claims and their equivalents.

What is claimed is:

1. A method of assembling a circuit board, the
    inserting a solder tab of a first electrical terminal into a first side of the circuit board;
    applying a layer of solder paste to a second side of the circuit board, the second side disposed opposite of the first side; and
    applying an initial layer of solder paste to the first side of the circuit board before inserting the solder tab into the first side of the circuit board, wherein the initial layer of solder paste and the layer of solder paste have different liquidus temperatures;
    wherein the solder tab extends no further than the second side of the circuit board, wherein the solder tab extends short of the second side of the circuit board, and the first electrical terminal contacts the first side of the circuit board.

2. The method of claim 1, comprising heating the initial layer of solder paste to fix the first electrical terminal relative to the circuit board before applying the layer of solder paste to the second side of the circuit board.

3. The method of claim 1, wherein after inserting the solder tab of the first electrical terminal into the circuit board, plating is disposed within a recess of the first electrical terminal.

4. The method of claim 3, wherein the first electrical terminal includes a lateral protrusion in contact with the first side of the circuit board, the lateral protrusion including the recess.

5. A method of assembling a circuit board, the method comprising:
    inserting a solder tab of a first electrical terminal into a first side of the circuit board; and
    applying a layer of solder paste to a second side of the circuit board, the second side disposed opposite of the first side;
    wherein the solder tab extends no further than the second side of the circuit board, and the first electrical terminal contacts the first side of the circuit board;
    wherein the first electrical terminal includes a plurality of solder tabs, and at least one of said plurality of solder tabs is inserted into the circuit board in an interference fit and at least one of said plurality of tabs is inserted into the circuit board in a clearance fit.

6. A method of assembling a circuit board, the method comprising:
    inserting a solder tab of a first electrical terminal into a first side of the circuit board; and
    applying a layer of solder paste to a second side of the circuit board, the second side disposed opposite of the first side;
    wherein the solder tab extends no further than the second side of the circuit board, and the first electrical terminal contacts the first side of the circuit board;
    wherein the solder tab is a first solder tab that includes a first width, the first electrical terminal includes a second solder tab that includes a second width, and the first width and the second width are different.

7. The method of claim 6, comprising:
    inserting a solder tab of a second electrical terminal into the second side of the circuit board; and
    heating the layer of solder paste to fix the first electrical terminal and the second electrical terminal relative to the circuit board.

8. The method of claim 7, wherein the solder tab of the second electrical terminal extends at least partially into the circuit board without extending entirely through the circuit board.

9. The method of claim 7, wherein at least one of the first electrical terminal and the second electrical terminal includes a plurality of solder tabs, and each of the plurality of solder tabs has a length such that it does not extend beyond an opposite side of the circuit board from which it is inserted.

* * * * *